Figure 1:
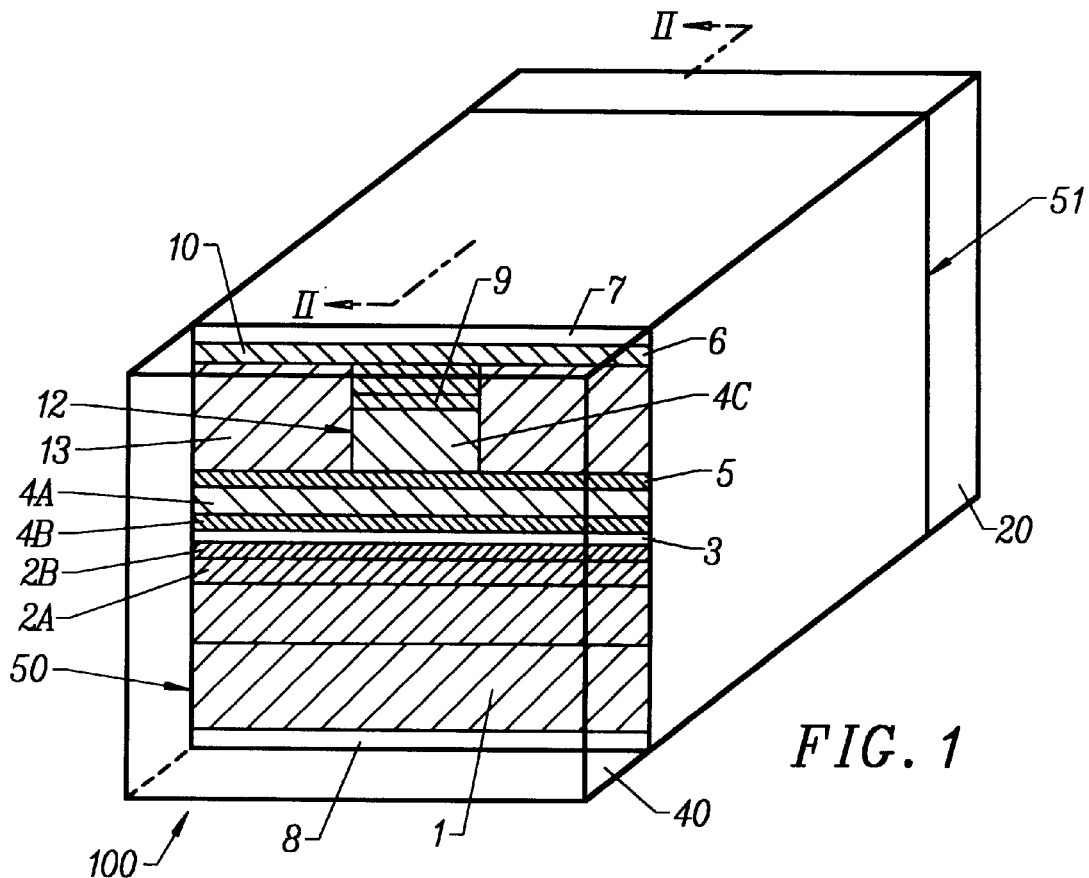

United States Patent [19]
Weegels et al.

[11] Patent Number: 6,078,603
[45] Date of Patent: Jun. 20, 2000

[54] SEMICONDUCTOR DIODE LASER, AND METHOD OF MANUFACTURING THEREOF

[75] Inventors: Leo M. Weegels; Henricus M. De Vrieze; Maria H. C. Vermeulen-Hartjes, all of Eindhoven, Netherlands

[73] Assignee: JDS Uniphase Corporation, San Jose, Calif.

[21] Appl. No.: 08/988,597

[22] Filed: Dec. 11, 1997

[30] Foreign Application Priority Data

Dec. 13, 1996 [EP] European Pat. Off. ............. 96203530

[51] Int. Cl.[7] ..................................... H01S 3/19
[52] U.S. Cl. ................................. 372/49; 372/25
[58] Field of Search ................. 372/49, 43, 25, 372/30, 28, 18

[56] References Cited

U.S. PATENT DOCUMENTS

| | | | |
|---|---|---|---|
| 3,849,738 | 11/1974 | Hakki | 372/49 |
| 4,317,086 | 2/1982 | Scifres et al. | 372/49 |
| 4,337,443 | 6/1982 | Umeda et al. | 372/49 |
| 4,635,263 | 1/1987 | Mollenauer | 372/3 |

FOREIGN PATENT DOCUMENTS 61-228692  10/1986  Japan .

OTHER PUBLICATIONS

"Compression of Femtosecond Optical Pulses with Dielectric Multilayer Interferometers" J. Kuhl et al, IEEE Transactions on Quantum Electronics, vol. QE–22, No. 1, Jan. 1986, p. 182–185.

*Primary Examiner*—James W. Davie
*Attorney, Agent, or Firm*—Michael A. Glenn

[57] ABSTRACT

A diode laser is disclosed that is self-pulsating without an increase in the starting current or a decrease in the efficiency. A special coating on an end face of the laser comprises in order a first mirror, a medium having an optical thickness which is at least substantially equal to an integer number of times half the wavelength of the generated electromagnetic radiation, and a second mirror. The coating comprises exclusively materials which have a higher bandgap value than that which corresponds to the wavelength of the generated radiation, while the reflectivities of the mirrors and the deviation of the optical thickness of the medium with respect to an integer number of times half the emission wavelength are chosen such that the group velocity dispersion (GVD) adjacent the wavelength of the generated electromagnetic radiation is negative, and preferably a minimum. Pulse widening owing to pulses arising from automatic mode locking is no longer possible due to a sufficiently negative group velocity dispersion. A laser exhibiting stable self-pulsation is thus provided.

10 Claims, 3 Drawing Sheets

SEMICONDUCTOR DIODE LASER, AND METHOD OF MANUFACTURING THEREOF

The invention relates to a semiconductor diode laser, often referred to as laser hereinafter for short, with a semiconductor body comprising a substrate and a semiconductor layer structure situated thereon with at least a first cladding layer of a first conductivity type, a second cladding layer of a second conductivity type opposed to the first, and an active layer arranged therebetween, and comprising a pn junction which, given a sufficient current strength in the forward direction, is capable of generating coherent electromagnetic radiation in a strip-shaped active region which lies within a resonant cavity and forms part of the active layer, the first and the second cladding layer being provided with electrical connection means, while the resonant cavity is bounded by end faces which are substantially perpendicular to the active region and of which at least one end face is provided with a coating, the generated electromagnetic radiation issuing from the laser in the form of pulses during continuous operation of the laser. The invention also relates to a method of manufacturing such a laser.

Such a laser is known from Japanese Patent JP-A-61-228692 published on May 3, 1984 in Patent Abstracts of Japan, vol. 11, no. 73 (E-486) [2250]. This describes a laser comprising a semiconductor body with a substrate of n-GaAs, a first cladding layer of n-AlGaAs, an active layer of AlGaAs, and a second cladding layer of p-GaAs. The two cladding layers, which form a pn junction, are provided with electrical connection means. Given a sufficient current strength through the pn junction, the laser is capable of generating electromagnetic radiation within a strip-shaped active region lying within a resonant cavity situated between two end faces. One end face of the laser is provided with a coating which comprises a large number of thin layers of alternately GaAs and AlGaAs. The coating thus acts as an absorbing region capable of saturation. That is to say that the absorption becomes saturated at a high intensity of the radiation, which phenomenon is also called bleaching. The presence of such a region leads to repetitive switching of the quality of the resonant cavity of the laser, and thus to pulsatory operation of the laser. The repetition frequency is determined by the speed with which the absorbing region regenerates itself after bleaching. A self-pulsating laser is attractive for various applications.

A disadvantage of the known laser is that it has a comparatively high starting current and a low efficiency. Another disadvantage is that the repetition frequency is strongly dependent on the recombination in the absorbing region, and thus inter alia also on the temperature and the current through the laser. Another possibility of making a laser pulsate is through RF (=Radio Frequency) control of the current through the laser, whereby the amplification and thus the generated radiation are modulated. A low starting current is indeed possible in such a case, but now a high repetition frequency is difficult to realize.

It is accordingly an object of the present invention to provide a self-pulsating laser which is not subject to the above disadvantages, which has a low starting current, and which can pulsate at high repetition frequencies.

According to the invention, a laser of the kind mentioned in the opening paragraph is for this purpose characterized in that the coating comprises in that order a first mirror, a medium having an optical thickness at least substantially equal to an integer number of times half the wavelength of the generated electromagnetic radiation, and a second mirror, said coating comprising exclusively materials having a greater bandgap than that which corresponds to the wavelength of the generated radiation, while the reflectivity values of the mirrors and the deviation of the optical thickness of said medium from an integer number of times half the wavelength of the generated radiation are chosen such that the group velocity dispersion is negative adjacent the wavelength of the generated electromagnetic radiation. The invention is based first of all on the recognition that a laser is capable of pulsating on its own accord owing to mode locking between two or more longitudinal modes of the resonant cavity. As soon as this is the case, however, the pulse will widen out when repeatedly traversing the resonant cavity, which in the end will result in continuous emission. The invention is further based on the recognition that a negative group velocity dispersion counteracts widening out of a pulse, and most of all on the recognition that such a counteracting effect can be realized in that an end face of the laser is provided with a suitable coating. This coating should form a Fabry-Pérot filter or Gires-Tournois interferometer together with an end face of the laser. Such a coating should then comprise in that order: a first mirror, a medium having an optical thickness at least substantially equal to, i.e. slightly smaller than an integer number of times half the wavelength of the generated radiation, and finally a second mirror. Absorption of this radiation does not take place owing to the fact that exclusively materials having a greater bandgap than the quantum of the generated radiation are used for the coating. As a result, the starting current of the laser is low and the efficiency high. The reflectivities of the mirrors and the above deviation of the optical thickness are so chosen that the group velocity dispersion is negative adjacent the emission wavelength. The pulse widening mentioned above will not take place, and the laser according to the invention will pulsate in a stable manner. Very high pulse frequencies can also be realized in this manner. The first mirror may be formed by the transition from the semiconductor body to the coating. Preferably, however, the first mirror comprises a multilayer structure, as does the second mirror.

In a preferred embodiment, the medium has an optical thickness of at least substantially once half the wavelength of the generated electromagnetic radiation, and the reflectivities of the mirrors and said deviation of the optical thickness of the medium are chosen such that the group velocity dispersion adjacent the wavelength of the generated radiation is a minimum. The desired value of said deviation may be estimated through calculations and subsequently determined with sufficient accuracy in experiments. The definition of "group velocity dispersion" used here, which is also important in view of said calculation, can be found in the article by J. Kuhl and J. Heppner published in IEEE Transactions on Quantum Electronics, vol. QE-22, no. 1, January 1986, pp. 182–185. Suitable reflectivity values of the mirrors are, for example, greater than or equal to 70%, and a suitable group velocity dispersion adjacent the wavelength of the generated electromagnetic radiation lies between 0 and −6 fs/THz (femtoseconds per TeraHertz) and is, for example, approximately −2 fs/THz. A laser having such a coating is found to pulsate in a stable manner. Preferably, the layers forming the first mirror, the medium, and the second mirror are dielectric materials. These have the required high bandgap values, are electrically insulating, and are easy to apply. Highly suitable materials are $Al_2O_3$, $Si_3N_4$ and $SiO_2$. A suitable coating would be, for example: the first mirror comprising a layer of $Al_2O_3$ and a layer of $Si_3N_4$, each having an optical thickness of ¼*λ, the medium comprising an $SiO_2$ layer with an optical thickness of substantially ½*λ, and the second mirror comprising 11 layers of alternately $Si_3N_4$ and $SiO_2$, each having an optical thickness of ¼*λ. Such a coating is highly suitable for a laser in the InGaP/AlInGaP material system which emits at approximately 675 nm. The group velocity dispersion which can be realized thereby is −0.5 fs/THz. Very good results were obtained with a coating in which the first mirror comprises a layer of $Al_2O_3$ and five layers of alternately $Si_3N_4$ and $SiO_2$, each with an optical thickness of ¼*λ, the medium comprises an $SiO_2$ layer with an optical thickness substantially equal to ½*λ, and the second mirror comprises 13 layers of alternately $Si_3N_4$ and $SiO_2$, each having an optical thickness of ¼*λ. Such a laser has a group velocity dispersion of approximately −2 fs/THz, also adjacent a wavelength of 670 nm.

In another embodiment, the medium comprises a semiconductor layer which is provided with electrical connections by means of which the refractive index of the semiconductor layer can be changed and which are preferably present on the lateral edges of the semiconductor layer. Since the semiconductor layer has a sufficiently, i.e. much greater bandgap than that which corresponds to the emission wavelength, such a laser will also have a low starting current and high efficiency. The semiconductor layer also renders it possible to modulate the refractive index of the coating at the area of the active region, for example by means of charge, current, or an electric field. The possibility thus arises of tuning the wavelength at which the group velocity dispersion is a minimum. This means that the emission wavelength of the laser need not be very accurately defined, which has a yield increasing effect.

In an important modification, the laser comprises a waveguide layer which adjoins the active region in longitudinal direction and which has a length of 1 to 20 mm, preferably 2 to 6 mm. This has the advantage that very high frequencies can now be realized, i.e. from 150 to 7.5 Gbit/s. A length of the resonant cavity of approximately 4 mm, for example, corresponds to a frequency of 40 Gbit/s, which is a very high frequency already. Such a resonant cavity length can be very well realized, even at the present state of laser technology. An important advantage of a pulsating laser according to the invention becomes apparent here: the frequency can be defined in a comparatively simple manner through the choice of the length of the resonant cavity. In addition, this frequency does not depend on, for example, the temperature of and the current through the laser, or at least to a much lesser extent than in the known laser.

A method of manufacturing a laser according to the invention whereby a semiconductor body is formed through the provision on a substrate of a semiconductor layer structure comprising at least a first cladding layer of a first conductivity type, a second cladding layer of a second conductivity type opposed to the first, and an interposed active layer, and whereby a pn junction is formed which, given a sufficient current strength in the forward direction, is capable of generating coherent electromagnetic radiation in a strip-shaped active region which lies within a resonant cavity and forms part of the active layer, while the first and the second cladding layer are provided with electrical connection means, the resonant cavity is bounded by end faces which are substantially perpendicular to the active region and of which at least one end face is provided with a coating, and the generated radiation issues from the laser in the form of pulses during continuous operation of the laser, according to the invention, is characterized in that the coating is formed in that consecutively a first mirror is formed on the end face, a medium is provided with an optical thickness which is at least substantially equal to an integer number of times half the wavelength of the generated electromagnetic radiation, and a second mirror is formed, materials being exclusively chosen for the coating which have a higher bandgap value than that which corresponds to the wavelength of the generated radiation, while the reflectivities of the mirrors and the deviation of the optical thickness of the medium from an integer number of times half the wavelength of the generated radiation are chosen such that the group velocity dispersion is negative adjacent the wavelength of the generated electromagnetic radiation.

Figure 2:
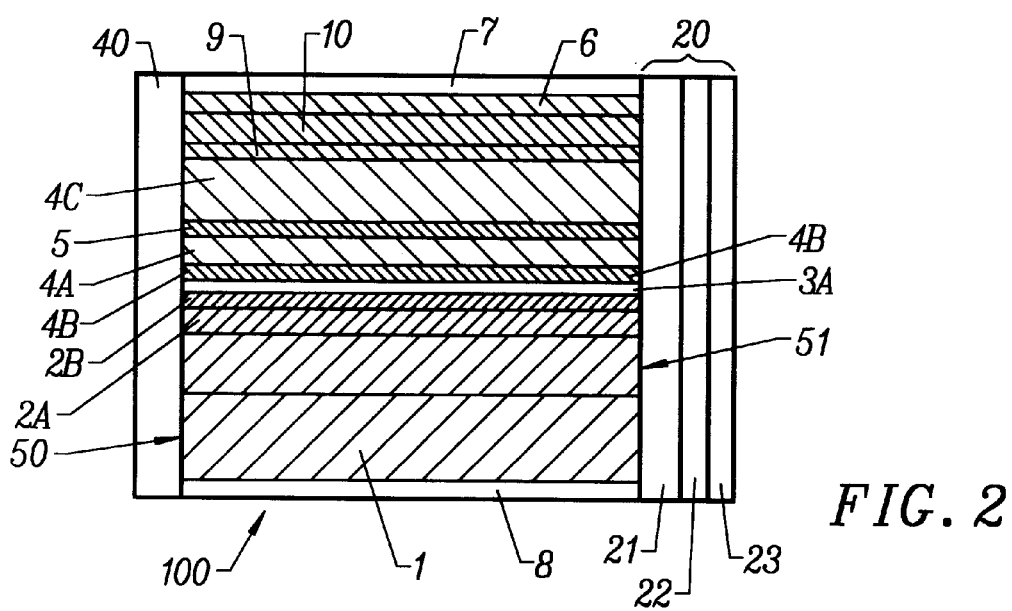
Figure 3:
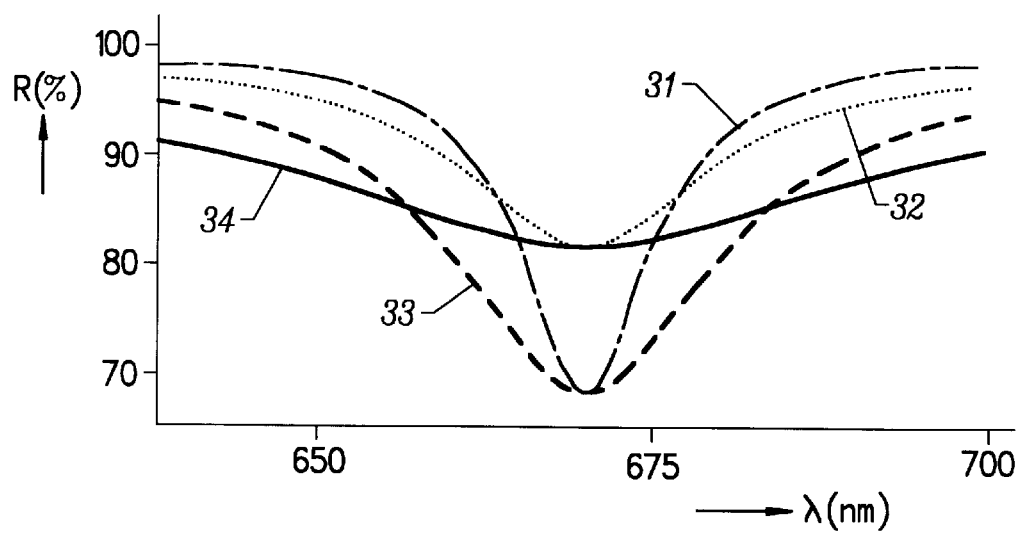
Figure 4:
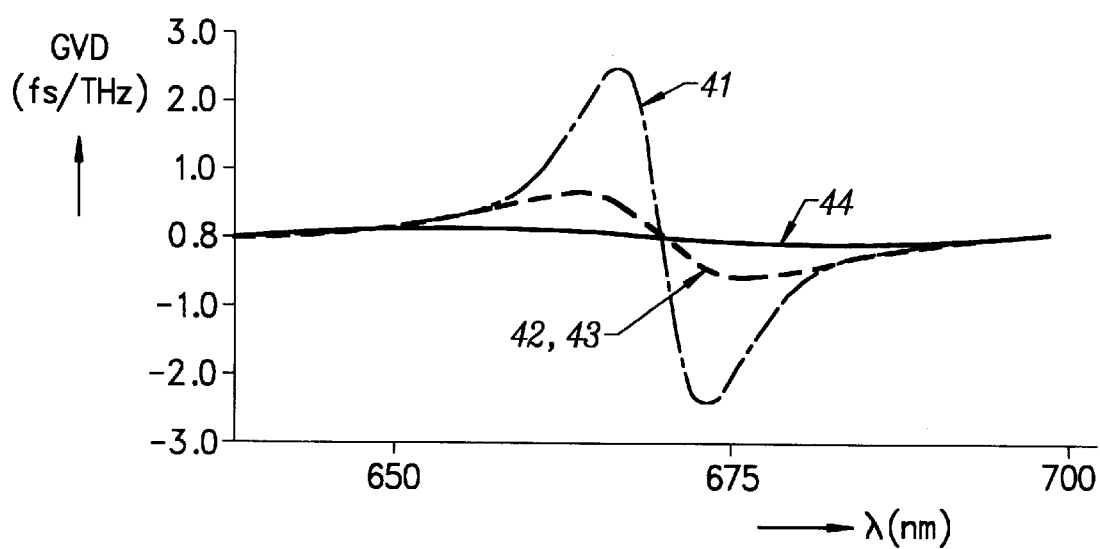
Figure 5:
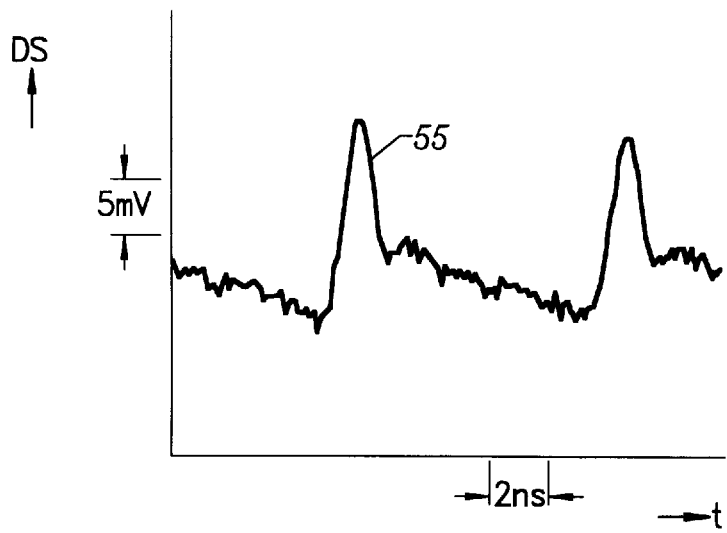
Figure 6:
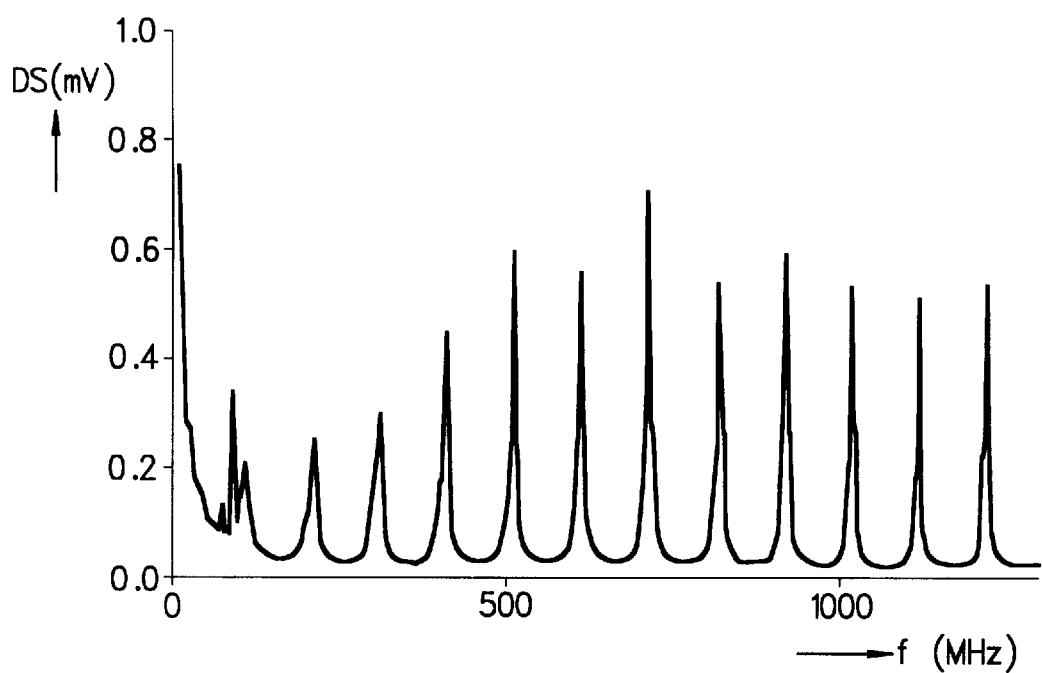

The invention will now be explained in more detail with reference to an embodiment and the accompanying drawing, in which FIG. 1 diagrammatically shows an embodiment of a laser according to the invention partly in perspective view and partly in cross-section;

FIG. 2 diagrammatically shows the laser of FIG. 1 in a cross-section taken on the line II—II;

FIG. 3 plots the reflectivity gradient of the coating of the laser of FIG. 1 as a function of the wavelength for various compositions of the coating;

FIG. 4 plots the gradient of the group velocity dispersion of the coating of the laser of FIG. 1 as a function of the wavelength for various compositions of the coating;

FIG. 5 shows the detector signal resulting from the radiation generated in the laser of FIG. 1 as a function of time; and FIG. 6 shows the spectrum of the detector signal shown in FIG. 5.

The Figures are purely diagrammatic and not drawn true to scale, the dimensions in the thickness direction being particularly exaggerated for the sake of clarity. Semiconductor regions of the same conductivity type have been hatched in the same direction as a rule.

FIG. 1 shows an embodiment of a laser according to the invention partly in perspective view and partly in cross-ssection. A diagrammatic cross-section of the laser of FIG. 1 taken on the line II—II is shown in FIG. 2. The laser in this example is of the SBR (=Selective Buried Ridge) type and comprises a semiconductor body 100 with an n-type semiconductor substrate 1 of n-GaAs. On the substrate 1 there is a semiconductor layer structure with an active layer 3 of InGaP disposed between two cladding layers 2, 4 of InGaAlP. Portions 2A, 4A of the cladding layers 2, 4 are doped and are of the n- and p-conductivity type, respectively. Other portions 2B, 4B form the so-called separate confinement layers. The second cladding layer 4 comprises a portion 4C which forms a mesa 12 next to which a current-blocking layer 13 of n-GaAs is present. A strip-shaped active region is formed in the active layer 3 below the mesa 12 during operation, in which region coherent electromagnetic radiation, here having a wavelength of 675 nm, is generated, which radiation leaves the laser in the form of pulses. The active region is present in a resonant cavity bounded by two end faces 50, 51 which are substantially perpendicular to the active region and of which at least one, here the end face 51, is provided with a coating 20. The laser further comprises an etching stopper layer 5, a transition layer 9, two contact layers 10, 6, and two metal layers 7, 8.

According to the invention, the coating 20 (see FIG. 2) comprises in that order a first mirror 21, a medium 22 having an optical thickness at least substantially equal to an integer number of times, here at least substantially once, half the wavelength of the generated radiation, and a second mirror 23, said coating 20 comprising exclusively materials, dielectric materials in this case, which have a higher bandgap value than that which corresponds to the generated radiation, while the reflectivity values of the mirrors 21, 23 and the deviation of the optical thickness of the medium 22 with respect to an integer number of times half the wavelength of the generated radiation, so here with respect to once half this wavelength, are chosen such that the group velocity dispersion (GVD) adjacent the wavelength of the generated radiation is negative. The generated radiation is not or hardly absorbed in said layer 20 owing to the high bandgap value of the materials of the coating 20. As a result, a laser according to the invention has a low starting current and a high efficiency. The composition of the coating 20 renders it possible for this coating to form a Fabry-Pérot filter or Gires-Tournois interferometer together with the end face 51 so that, provided the reflectivities of the mirrors 21, 23 and the optical thickness of the medium 22 are correctly chosen, the group velocity dispersion is negative adjacent the wavelength of the generated radiation. A pulsatory operation of the laser owing to automatic mode locking is maintained thereby. This is because a pulse running (to and fro) through the laser is no longer widened out by the presence of the negative group velocity dispersion, but on the contrary compressed. A self-pulsating laser with a particularly low starting current and high efficiency is thus created. The pulse frequency can in addition be adjusted in a simple manner through the choice of a suitable length of the resonant cavity of the laser. In contrast to the known pulsating laser, the pulse frequency here is not dependent on the temperature or on the current through the laser, or at least to a much lesser degree.

In this example, the medium 22 has an optical thickness which is at least substantially equal to half the wavelength of the generated radiation, and the reflectivities and the deviation of the optical thickness of the medium 22 with respect to once half the wavelength of the generated radiation are chosen such that the group velocity dispersion adjacent the wavelength of the generated radiation is a minimum. The required compressing power may thus be realized by means of a comparatively simple construction of the coating 20. $Al_2O_3$, $Si_3N_4$, and $SiO_2$ were used here for composing the coating 20, which materials are easy to apply. In this example, the first mirror 21 comprises an $Al_2O_3$ layer and five layers of alternately $Si_3N_4$ and $SiO_2$, each having an optical thickness of ¼*λ, the medium 22 comprises an $SiO_2$ layer with an optical thickness at least substantially equal to ½*λ, and the second mirror 23 comprises 13 layers of alternately $Si_3N_4$ and $SiO_2$, each having an optical thickness of ¼*λ. The optical thicknesses are attuned to a wavelength of 670 nm in the laser in this example, which emits at 675 nm. The optical thickness of ¼*λ for $Al_2O_3$, $Si_3N_4$, and $SiO_2$ then corresponds to an actual thickness of 103.2 nm, 84.5 nm, and 115.5 nm, respectively. The medium 22 accordingly is 231 nm thick. As a result, the medium 22 has a thickness which is at least substantially equal to once half the wavelength of the generated radiation (675 nm). A suitable composition of the coating 20 for the laser according to the invention can be explained in more detail with reference to FIG. 3.

FIG. 3 shows the gradient of the reflectivity of the coating 20 of the laser of FIG. 1 as a function of the wavelength for various compositions of the coating 20. Curve 31 corresponds to the present embodiment of the laser, where the coating 20 comprises a total of 20 constituent layers. Curves 32, 33, and 34 correspond to lasers where the coating 20 comprises 18, 14, and 12 constituent layers, respectively. FIG. 4 shows the gradient of the group velocity dispersion (GVD) as a function of the wavelength for various compositions of the coating 20. The curves 41, 42, 43, and 44 correspond to the lasers having coatings 20 whose reflection values correspond to curves 31, 32, 33, and 34 in FIG. 3, respectively. FIG. 4 shows that a suitable negative value for the group velocity dispersion adjacent 685 nm can be realized by means of a coating 20 which comprises 14 or 18 constituent layers and whose optical thicknesses are based on a wavelength of approximately 670 nm. The reflection of the coating is always a minimum (see FIG. 3) for this latter wavelength, while the GVD (see FIG. 4) is always approximately zero. This means that the GVD (see FIG. 4) is always smaller than or equal to zero and (at least substantially) a minimum in a laser which emits at 675 nm, such as the laser in the present example. The strongest compressing effect is supplied by a coating 20 which, as in this example, comprises 20 constituent layers (FIG. 4, curve 41). In that case the reflection amounts to approximately 80% (FIG. 3, curve 31) at 675 nm, while the GVD is approximately −2 fs/THz (FIG. 4, curve 41). The group velocity dispersion hardly differs from zero if the coating 20 comprises no more than 10 constituent layers. Coatings having 14 or 18 constituent layers (FIG. 4, curves 42 and 43) lead to intermediate values for the GVD. Not shown in the drawing is the situation where the thickness of the medium 22 of the coating 20 is at least substantially equal to a larger number of times half the emission wavelength. If this number is, for example, eight, a GVD value of −6 fs/THz is achievable.

FIG. 5 shows the detector signal (DS) caused by radiation generated in the laser of FIG. 1 as a function of time (t). The curve 55 represents the average of 100 scans. It is apparent that the laser, which receives a continuous electric current, pulsates of its own accord with a basic frequency of approximately 102 MHz (Δt=9.77 ns). The pulse width, which is determined here by the instrumental resolution, is approximately 1 ns. The length of the resonant cavity was increased by means of an external mirror present at approximately 1.45 m away from the laser in this example to render it possible to observe the pulsation in the time domain. FIG. 6 shows the spectrum of the detector signal (DS) shown in FIG. 5, which consists of sharp peaks corresponding to the higher-order harmonic of the basic frequency of the resonant cavity (102 MHz). No pulses are observed when the feedback of the external mirror is interrupted. Neither are any pulses observed when a laser is used whose semiconductor body 100 is identical to the one described here, but whose end faces are provided with conventional coatings of substantially the same reflectivity as the coatings 20, 40 with which the end faces 50, 51 of the present embodiment of the laser are provided, and where the group velocity dispersion adjacent the emission wavelength is substantially zero. In this example, the further coating 40 of the laser is low-reflecting (R=+/−10%), so that the end face 50 serves as an exit face for the generated radiation. The further coating 40 comprises an $Al_2O_3$ layer with an optical thickness of approximately 0.26*λ. The dimensions (L×W) of the laser are 500×300 $\mu m^2$, and the active region is 5 $\mu m$ wide.

The laser according to this example is manufactured as follows by a method according to the invention. The manufacture of the semiconductor body 100 of the laser takes place as described, for example, in European Patent Application by Applicant which was published on Sep. 25, 1996 under no. 0.733.270. After the semiconductor body 100 has been manufactured and a conductive layer 7, 8 has been provided on the upper and lower side thereof, respectively, strips are cleaved off which each comprise a row of lasers and whose side faces form the end faces 50, 51 of the lasers.

After it has been ascertained what is the exact emission wavelength of the laser to be formed, 675 nm in this case, the coatings 40, 20 are provided on the respective side faces of the strips, and accordingly on the respective end faces 50, 51 of the lasers to be formed, for example by means of sputtering. During this, the reflectivities of the mirrors 21, 23 and the deviation of the thickness of the medium 22 with respect to an integer number of times half the emission wavelength are chosen such that the GVD adjacent the emission wavelength is negative, and preferably a minimum. The coating 20 is here built up from the 20 constituent layers described above. Then individual lasers according to the invention suitable for further mounting are obtained by means of repeated cleaving of said strips.

The invention is not limited to the embodiment described since many modifications and variations are possible to those skilled in the art within the scope of the invention. Thus it is possible to choose materials, compositions, and thicknesses for the various (semiconductor) layers other than those mentioned in the example. The semiconductor materials may be chosen not only from the InGaP/AlInGaP material system, as in the example, but also from the (Al)GaAs/AlGaAs or the InGaAsP/InP material system. The first two systems are widely used especially in the field of optical disc systems, the latter system is mostly used in optical glass fiber communication. When the invention is used for the manufacture of an optical clock, accordingly, this latter system should be especially considered. Furthermore, the conductivity types may all be replaced (simultaneously) with their opposites. It is especially noted that the invention could also be used to advantage in diode lasers other than III–V diode lasers, such as II–VI diode lasers. Structures other than those mentioned in the example may alternatively be used, such as other index guided structures or a gain guided structure.

We claim:

1. A semiconductor diode laser with a semiconductor body (100) comprising a substrate (1) and a semiconductor layer structure situated thereon with at least a first cladding layer (2) of a first conductivity type, a second cladding layer (4) of a second conductivity type opposed to the first, and an active layer (3) arranged therebetween, and comprising a pn junction which, given a sufficient current strength in the forward direction, is capable of generating coherent electromagnetic radiation in a strip-shaped active region which lies within a resonant cavity and forms part of the active layer (3), the first and the second cladding layer (2, 4) being provided with electrical connection means (7, 8), while the resonant cavity is bounded by end faces (50, 51) which are substantially perpendicular to the active region and of which at least one end face (51) is provided with a coating (20), the generated electromagnetic radiation issuing from the laser in the form of pulses during continuous operation of the laser, characterized in that the coating (20) comprises in that order a first mirror (21), a medium (22) having an optical thickness at least substantially equal to an integer number of times half the wavelength of the generated electromagnetic radiation, and a second mirror (23), said coating (20) comprising exclusively materials having a greater bandgap than that which corresponds to the wavelength of the generated radiation, while the reflectivity values of the mirrors and the deviation of the optical thickness of said medium from an integer number of times half the wavelength of the generated radiation are chosen such that the group velocity dispersion is negative adjacent the wavelength of the generated electromagnetic radiation.

2. A semiconductor diode laser as claimed in claim 1, characterized in that the medium (22) has an optical thickness of at least substantially once half the wavelength of the generated electromagnetic radiation, and the reflectivities of the mirrors and said deviation of the optical thickness of the medium from once half the wavelength of the generated radiation are chosen such that the group velocity dispersion adjacent the wavelength of the generated radiation is a minimum.

3. A semiconductor diode laser as claimed in claim 1, characterized in that the first mirror (21), the medium (22), and the second mirror (23) comprise layers of dielectric materials.

4. A semiconductor diode laser as claimed in claim 1, characterized in that the coating (20) comprises layers (21, 22, 23) of $Al_2O_3$, $Si_3N_4$, and $SiO_2$.

5. A semiconductor diode laser as claimed in claim 1, characterized in that the first mirror (21) comprises a layer of $Al_2O_3$ and a layer of $Si_3N_4$, each having an optical thickness of ¼*λ, the medium (22) comprises an $SiO_2$ layer with an optical thickness of substantially ½*λ, and the second mirror (23) comprises 11 layers of alternately $Si_3N_4$ and $SiO_2$, each having an optical thickness of ¼*λ.

6. A semiconductor diode laser as claimed in claim 1, characterized in that the first mirror (21) comprises a layer of $Al_2O_3$ and five layers of alternately $Si_3N_4$ and $SiO_2$, each having an optical thickness of ¼*λ, the medium (22) comprises an $SiO_2$ layer with an optical thickness substantially equal to ½*λ, and the second mirror (23) comprises 13 layers of alternately $Si_3N_4$ and $SiO_2$, each having an optical thickness of ¼*λ.

7. A semiconductor diode laser as claimed in claim 1, characterized in that the medium (22) comprises a semiconductor layer which is provided with electrical connections by means of which the refractive index of the semiconductor layer can be changed and which are preferably present on the lateral edges of the semiconductor layer.

8. A semiconductor laser diode as claimed in claim 1, characterized in that the semiconductor diode laser in addition comprises a waveguide layer situated between cladding layers, bounding the strip-shaped active region in longitudinal direction, and having a length of 1 to 20 mm, preferably 2 to 6 mm.

9. An optical clock comprising a semiconductor diode laser as claimed in claim 1.

10. A method of manufacturing a semiconductor diode laser whereby a semiconductor body (100) is formed through the provision on a substrate (1) of a semiconductor layer structure comprising at least a first cladding layer (2) of a first conductivity type, a second cladding layer (4) of a second conductivity type opposed to the first, and an interposed active layer (3), and whereby a pn junction is formed which, given a sufficient current strength in the forward direction, is capable of generating coherent electromagnetic radiation in a strip-shaped active region which lies within a resonant cavity and forms part of the active layer (3), while the first and the second cladding layer (2, 4) are provided with electrical connection means (7, 8), the resonant cavity is bounded by end faces (50, 51) which are substantially perpendicular to the active region and of which at least one end face (51) is provided with a coating (20), and the generated radiation issues from the laser in the form of pulses during continuous operation of the laser, characterized in that the coating (20) is formed in that consecutively a first mirror (21) is formed on the end face (51), a medium (22) is provided having an optical thickness which is at least substantially equal to an integer number of times half the wavelength of the generated electromagnetic radiation, and a second mirror (23) is formed, materials being exclusively chosen for the coating (20) which have a higher bandgap value than that which corresponds to the wavelength of the generated radiation, while the reflectivities of the mirrors and the deviation of the optical thickness of the medium from an integer number of times half the wavelength of the generated radiation are chosen such that the group velocity dispersion adjacent the wavelength of the generated electromagnetic radiation is negative, and preferably substantially a minimum.

* * * * *